United States Patent [19]
Saleh et al.

[11] Patent Number: 5,663,890
[45] Date of Patent: Sep. 2, 1997

[54] METHOD, APPARATUS AND COMPUTER PROGRAM PRODUCT FOR DETERMINING A FREQUENCY DOMAIN RESPONSE OF A NONLINEAR MICROELECTRONIC CIRCUIT

[75] Inventors: Resve A. Saleh, San Jose, Calif.; Jeffrey G. Mueller, Dallas; Brian A. A. Antao, Austin, both of Tex.

[73] Assignee: The Board of Trustees University of Illinois, Urbana, Ill.

[21] Appl. No.: 625,143

[22] Filed: Apr. 1, 1996

[51] Int. Cl.⁶ .................................................. G06F 9/06
[52] U.S. Cl. .................... 364/490; 364/488; 364/489; 364/578; 327/551; 395/183.09
[58] Field of Search ............................... 364/574, 801, 364/488, 489, 578, 990; 327/551–553; 330/107; 395/183.01, 183.08, 183.09

[56] References Cited

U.S. PATENT DOCUMENTS

| | | | |
|---|---|---|---|
| 5,313,398 | 5/1994 | Rohrer et al. | 364/468 |
| 5,535,370 | 7/1996 | Raman et al. | 395/550 |
| 5,539,652 | 7/1996 | Tegethoff | 364/490 |

OTHER PUBLICATIONS

S. C. Fang, et al., *SWITCAP: A Switched–Capacitor Network Analysis Program Part I: Basic Features*, IEEE Circuits and Systems Magazine, Sep. 1983, pp. 4–10.

Richard J. Trihy, et al., *A Switched Capacitor Circuit Simulator: AWEswit*, IEEE Journal of Solid–State Circuits, vol. 29, No. 3, Mar. 1994, pp. 217–225.

George W. Rhyne, et al., *Frequency–Domain Nonlinear Circuit Analysis Using Generalized Power Series*, IEEE Transactions On Microwave Theory And Techniques, vol. 36, No. 2, Feb. 1988, pp. 379–387.

Kenneth S. Kundert, et al., *A Mixed Frequency—Time Approach for Distortion Analysis of Switching Filter Circuits*, IEEE Journal of Solid–State Circuits, vol. 24, No. 2, Apr. 1989, pp. 443–451.

Ken Suyama, et al., *Simulation of Mixed Switched–Capacitor/Digital Networks with Signal–Driven Switches*, IEEE Journal of Solid–State Circuits, vol. 25, No. 6, Dec. 1990, pp. 1403–1413.

*Primary Examiner*—Emanuel T. Voeltz
*Assistant Examiner*—Craig Steven Miller
*Attorney, Agent, or Firm*—Bell, Seltzer, Park & Gibson

[57] ABSTRACT

A method, apparatus and computer program product for determing a frequency response of a nonlinear microelectronic circuit includes simulating the behavior of the circuit over a broad frequency range by producing a plurality of periodic component signals, having respective noninterfering frequencies within the frequency range, as an input signal to the nonlinear microelectronic circuit. A time domain simulation of the behavior of the microelectronic circuit is then produced and followed by production of a frequency domain simulation from the time domain simulation once a steady-state condition has been reached. Only a single time domain simulation is required and it can be generated simultaneously for all frequencies in the desired range without the occurrence of second-order harmonic interferences. The plurality of periodic component signals are summed together and produced as a multifrequency input signal by initially determining respective frequencies (and amplitudes) for the component signals and then determining whether one or more of the frequencies, or second-order harmonics or intermodulation components of the frequencies, equals another of the frequencies to thereby cause interference among the plurality of periodic component signals. If an interference is present, then at least one of the frequencies is adjusted to reduce potential interferences among the plurality of periodic component signals and thereby obtain a new plurality of frequencies for the periodic component signals. These operations repeatedly performed to eliminate second-order interferences among the periodic component signals, before using the periodic component signals as an input signal.

20 Claims, 6 Drawing Sheets

METHOD, APPARATUS AND COMPUTER PROGRAM PRODUCT FOR DETERMINING A FREQUENCY DOMAIN RESPONSE OF A NONLINEAR MICROELECTRONIC CIRCUIT

FIELD OF THE INVENTION

This invention relates to the design, testing and manufacture of microelectronic circuits and systems, and more particularly to apparatus and methods for evaluating the performance of nonlinear microelectronic circuits and systems.

BACKGROUND OF THE INVENTION

The large capital investment required to design, test and fabricate microelectronic devices and the difficulty in redesigning and/or reworking microelectronic devices which do not operate as planned, have emphasized the need to simulate circuit performance at each stage of design and development. Accordingly, to meet this need many circuit simulators have been developed and marketed. One widely used time domain circuit simulator is a program which was developed at the Electronics Research Laboratory of the University of California, Berkeley, known as SPICE. In general, SPICE is a system for simulating nonlinear circuits in time, using nonlinear time-independent generalized admittance representations. A popular version of SPICE (SPICE 2) is described in "SPICE Version 2G.6 User's Guide" Berkeley: University of California, Department of Electrical Engineering and Computer Science, 1980 by Vladimirescu et al.

Circuit simulators have also been the subject of patent protection because they are an integral part of the design and fabrication of microelectronic devices. Recently issued patents covering circuit simulators are U.S. Pat. No. 4,918,643 to Wong entitled *Method and Apparatus for Substantially Improving the Throughput of Circuit Simulators;* U.S. Pat. No. 5,047,971 to Horwitz entitled *Circuit Simulation;* U.S. Pat. No. 5,051,911 to Kimura et al. entitled *Apparatus for Effecting Simulation of a Logic Circuit and Method for Producing a Semiconductor Device Using the Simulation Approach;* U.S. Pat. No. 5,313,398 to Rohrer et al. entitled *Method and Apparatus for Simulating a Microelectronic Circuit;* and U.S. Pat. No. 5,379,231 to Pillage et al. entitled *Method and Apparatus for Simulating a Microelectronic Interconnect Circuit.*

Circuit simulators are typically software based, and are designed to accept a description if the circuit which defines the circuit topology and element values. Each element in the circuit is typically specified by an element line containing the element name, the connecting nodes, and electrical parameter values. Simulators typically simulate circuits which contain passive devices such as resistors, diodes, capacitors and inductors, stimuli such as voltage and current sources and active devices such as bipolar junction transistors (BJT), junction field effect transistors (JFET) and metal oxide semiconductor field effect transistors (MOSFET). Simulators are also typically configured to perform DC analysis, AC small signal analysis and transient analysis in the time domain where the behavior of the circuit is determined as a function of time. This is in contrast to frequency domain simulation where the behavior of the circuit is determined as a function of frequency instead of time.

However, one aspect of frequency domain circuit simulation that can be particularly problematic is the simulation of circuits having nonlinear characteristics and behavior. Typical circuits exhibiting nonlinear behavior include clocked circuits such as switched-capacitor circuits. Switched-capacitor circuits have been widely used for integrating a variety of analog functions on a chip including the analog functions performed by filters, sigma-delta modulators and data converters, for example. Switched-capacitor technology has also been found suitable for analog integrated circuit design because of its ability to simulate precision resistors through ratio-matched capacitive components. Unfortunately, conventional simulators capable of generating frequency domain responses for switched-capacitor circuits using frequency domain analyses typically ignore the nonlinearities and nonidealities associated with these circuits which can be caused by charge injection, voltage dependence, the presence of finite poles and zeros and op-amp settling time, for example. Moreover, conventional nonlinear frequency domain response simulators which handle the nonlinearities using time domain analyses are typically extremely time consuming, particularly for circuits having large transient response components. Further compounding the difficulty of simulating switched-capacitor circuits is the fact that they typically include very fast switching devices which are clocked at rates much higher than the frequencies of the circuit's input signals.

Attempts have been made to address these limitations of conventional circuit simulators in simulating the frequency domain response of nonlinear circuits including switched-capacitor circuits. One attempt to simulate the behavior of switched-capacitor circuits is described in an article by K. Suyama et al. entitled *Simulation of Mixed Switched-Capacitor/Digital Networks with Signal-Driven Switches,* IEEE Journal of Solid-State Circuits, Vol. 25, No. 6, pp. 1403–1413, December (1990). Another attempt is described in an article by R. J. Trihy and R. A. Rohrer, entitled *A Switched-Capacitor Circuit Simulator: AWEswit"* IEEE Journal of Solid-State Circuits, Vol. 29, No. 3, pp. 217–225, March (1994). These attempts use charge-based formulations with idealized models for op-amps and switches to increase the speed of producing a simulation. But, because these simulators analyze a macromodel equivalent of ;the actual circuit, which is useful for obtaining a first-order approximated frequency response, they typically do not take into account many of the nonlinearities and secondary effects that may be present in the actual circuit. Some of these nonlinearites are due to the behavior of the switching devices, such as charge injection during MOS transistor switching.

To further address some of these limitations of conventional simulators, other attempts have been made which include a mixed frequency-time method (MFT), as described in an article by Kundert et al. entitled *A Mixed-Frequency Time Approach for Distortion Analysis of Switching Filter Circuits,* IEEE Journal of Solid-State Circuits, Vol. 24, No. 2, pp. 443–451, April (1989); and a non-linear steady-state method, as described in an article by Okumura et al. entitled *An Efficient Small Signal Frequency Analysis Method of Nonlinear Circuits with Two Frequency Excitations,* IEEE Transactions on Computer-Aided Design, Vol. 9, No. 3, pp. 225–235, March (1990). However, these methods are typically elaborate and use specialized formulations which may not be generally applicable to a wide range of nonlinear circuit applications. Moreover, while these latter methods may be capable of generating frequency domain responses in the presence of nonlinearities, they can be computationally expensive when the number of desired frequencies for the response is large. This is particularly true when repeated analysis of the frequency domain response of a circuit is required to provide a circuit designer with information illustrating the impact and influence of device and circuit parameter variations on overall circuit performance. Such repeated analysis is typically required to assess the manufacturability of a proposed circuit design and likely production yield. Unfortunately, repeated analysis of the circuit over a parameter range using preferred techniques such as the Monte Carlo method, is often too computationally expensive when these conventional simulators are used.

Thus, notwithstanding these attempts to simulate the performance and behavior of nonlinear microelectronic circuits, there still exists a need for simulators which are capable of generating accurate frequency domain response data for nonlinear circuits over a broad frequency range. There also exists a continuing need to develop simulators of nonlinear circuits which are highly efficient so that repeated analysis to study the effects of parametric variations can be performed efficiently and economically.

SUMMARY OF THE INVENTION

It is therefore an object of the present invention to provide an improved method, apparatus and computer program product for simulating the behavior of a nonlinear microelectronic circuit which takes into account the nonlinearities and nonidealities of the components of the circuit.

It is a further object of the present invention to provide a method, apparatus and computer program product for accurately and efficiently simulating the behavior of clocked and continuous time nonlinear microelectronic circuits.

It is another object of the present invention to provide an improved method, apparatus and computer program product for determining a frequency domain response of a nonlinear microelectronic circuit over a broad frequency range from a single time domain simulation of the behavior of the nonlinear microelectronic circuit.

It is still another object of the present invention to provide an improved method, apparatus and computer program product for determining a frequency domain response of a nonlinear microelectronic circuit which is compatible with a variety of conventional circuit simulators and simulating methods.

These and other objects are provided, according to the present invention, by a method, apparatus and computer program product for simulating the behavior of a nonlinear microelectronic circuit over a broad frequency range by producing a plurality of periodic component signals, having respective noninterfering frequencies within the frequency range, as an input signal to the nonlinear microelectronic circuit. A time domain simulation of the behavior of the microelectronic circuit in response to the input signal is then produced and followed by production of a frequency domain simulation from the time domain simulation once a steady-state condition has been reached. According to the present invention, it is unnecessary to produce separate time domain simulations of the behavior of the microelectronic circuit for each frequency in the range. Instead, only a single time domain simulation is required and it can be generated simultaneously for all frequencies in the desired range without second-order harmonic interferences between the frequencies of the periodic component signals, notwithstanding the presence of nonlinear components within the microelectronic circuit.

In particular, the plurality of periodic component signals having respective amplitudes are summed together and provided as a multifrequency input signal by initially determining respective frequencies (and amplitudes) for the component signals and then determining whether one or more of the frequencies, or second-order harmonics or intermodulation components of the frequencies, equals another of the frequencies to thereby cause interference among the plurality of periodic component signals. If an interference is present, then at least one of the frequencies is adjusted upward or downward to reduce potential interferences among the plurality of periodic component signals and thereby obtain a new plurality of frequencies for the periodic component signals. These operations are then repeatedly performed, if necessary, to eliminate all second-order interferences among the plurality of periodic component signals, before performing a time domain simulation of the behavior of the microelectronic circuit using the periodic component signals as an input signal. This time domain simulation may be produced using conventional time domain circuit simulators such as SPICE.

The time domain simulation is also performed efficiently by detecting a steady state condition in the behavior of the nonlinear microelectronic circuit and then producing a frequency domain response of the behavior of the microelectronic circuit by performing a discrete Fourier transform (DFT) operation on the time domain simulation to extract frequency domain information relating to each of the plurality of periodic component signals. Preferably, the discrete Fourier transform operation is performed by sampling the time domain simulation at evenly spaced time intervals to extract magnitude and phase information therefrom.

Accordingly, the method, apparatus and computer program product of the present invention are capable of producing a frequency domain simulation of the behavior of a nonlinear microelectronic circuit which takes into account the nonlinearities of the components of the circuit, is free of second-order harmonic interferences and requires the production of only one time domain simulation using an input signal which contains a plurality of noninterfering periodic component signals.

DESCRIPTION OF A PREFERRED EMBODIMENT

The present invention now will be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art. Like numbers refer to like elements throughout.

Figure 1:
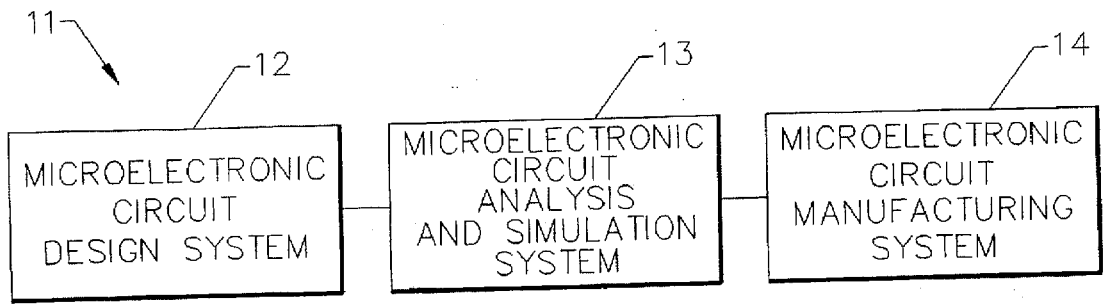
FIG. 1 illustrates a functional block diagram of a computer aided microelectronic circuit design and manufacturing system.

Referring now to FIG. 1, a functional block diagram of a computer aided microelectronic circuit design and manufacturing system 11 is shown. The system includes three general subsystems: a microelectronic circuit design system 12, a microelectronic circuit analysis and simulation system 13 and a microelectronic circuit manufacturing system 14. The microelectronic circuit design system 12 may include circuit libraries or macros for such elements as clocked and continuous-time circuits, logic gates, registers, processors and memory elements. Also typically included is a checking system which insures that the design meets the overall constraints and design rules which are compatible with the manufacturing system 14. Once it is ensured that a functional design is present, a wiring program may determine the actual wiring interconnect paths between the elements of the microelectronic circuit.

The microelectronic circuit analysis and simulation system 13 is typically employed near the end of the design process and acts as an independent verification of the operation of the design, and as a means by which relatively subtle parameter optimization can be performed. As already described in the background section, SPICE is a general purpose circuit simulation program for nonlinear DC, nonlinear transient, and linear AC analysis of circuits. Circuits may include switched-capacitor circuits for integrating analog functions on a chip including analog functions performed by filters, delta-sigma modulators and data coverters and these circuits may contain op-amps, resistors, capacitors, inductors, mutual inductors, independent voltage or current sources, and the foremost semiconductor devices: diodes, BJTs, JFETs and MOSFETs.

After the parameters of the microelectronic circuit design are optimized using the microelectronic circuit analysis and simulation system 13, the parameters are provided to a microelectronic circuit manufacturing system 14 in order to produce the integrated circuit. The microelectronic circuit manufacturing system may generate the required masks, and may control the manufacturing tools for performing the various processes on semiconductor wafers, and may perform other functions to produce integrated circuit chips.

It will be understood by those having skill in the art that the microelectronic circuit design system 12, microelectronic circuit analysis and simulation system 13 and various parts of the microelectronic circuit manufacturing system 14 may be realized as software modules running on a computer system. Alternatively, stand alone systems may be provided. The general design and operation of systems 12 and 14 are well known to those having a skill in the art and need not be described further herein.

Figure 2:
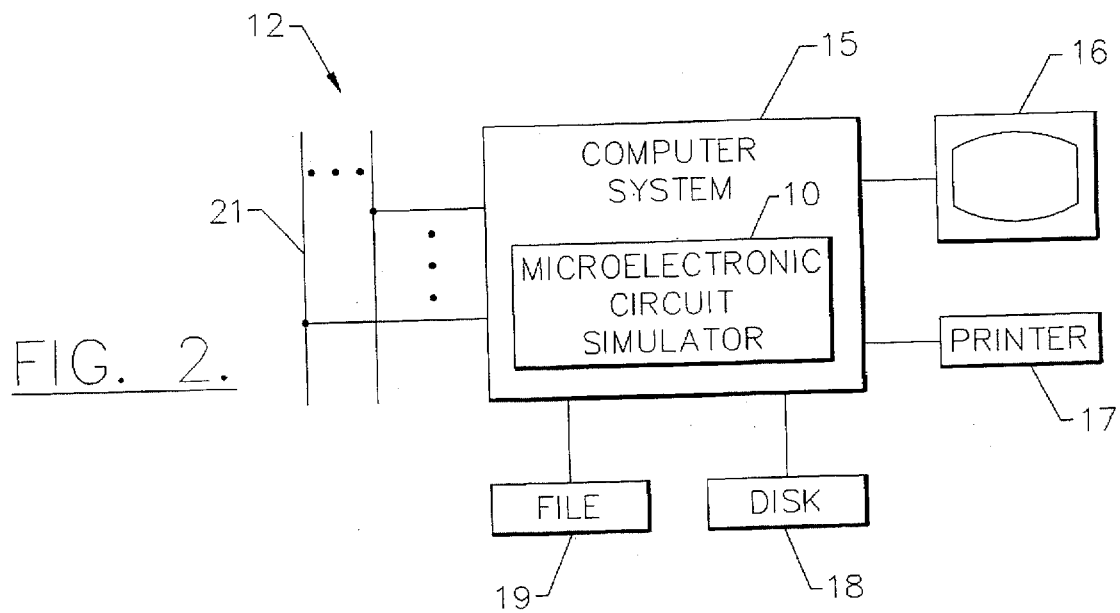
FIG. 2 illustrates a general hardware description of the microelectronic circuit analysis system illustrated in FIG. 1.

Referring now to FIG. 2, a general hardware description of the microelectronic circuit analysis and simulation system 13 of FIG. 1 will be described. As shown in FIG. 2, the microelectronic circuit analysis and simulation system 13 includes a computer system 15 which may be a mainframe, minicomputer, workstation or a personal computer. The computer system may include a number of software subsystems running thereon. Examples of such software subsystems may be a SPICE program upfitted to operate in conjunction with the present invention. The circuit simulator 10 may accept a representation of a microelectronic circuit via a file input 19, disk input 18, or via a data bus 21 which may interface to the microelectronic circuit design system 12 (FIG. 1). A display 16 and printer 17 may be used to provide results of the microelectronic circuit simulation. The results may also be communicated back to the microelectronic circuit design system 12 or forward to the microelectronic circuit manufacturing system 14 (FIG. 1) via tape 19, disk 18 or data bus 21. The hardware design of the above described components 16–19 and 21 of the microelectronic circuit analysis and simulation system 13 is well known to those having skill in the art and need not be described further. As one example, the microelectronic circuit simulator of the present invention may be run on a computer system including a Sun Solaris™ workstation, Hewlett-Packard UX workstation, IBM RS-6000 or Digital Equipment Company (DEC) Station 5000.

Figure 3:
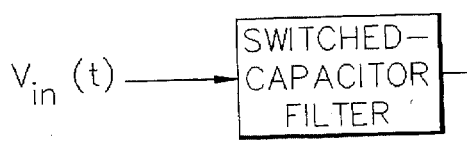
FIG. 3 illustrates a block diagram of a switched-capacitor filter circuit, according to the prior art.

Referring now to FIG. 3, a conventional method of simulating the frequency domain behavior of a microelectronic circuit will first be described. In particular, FIG. 3 illustrates a switched-capacitor filter circuit which can be simulated in the frequency domain by initially performing a plurality of separate time domain simulations using a respective plurality of input signals (e.g., sinusoidal signals) having frequencies which span a desired frequency range and then converting each of the time domain simulations to magnitude and phase values. The magnitude and phase values for each of the time domain simulations can then be combined into a single magnitude and phase plot to produce the frequency domain response. Accordingly, if there are/x/ frequencies in the desired frequency range, N time domain simulations of the entire circuit must be performed. If only conventional linearized analysis or analysis with linear macromodels is required, this method of producing/x/time domain simulations for the N frequencies in the desired frequency range is acceptable. However, because many linear approximations do not provide sufficiently accurate results for many nonlinear circuits such as the switched-capacitor filter circuit of FIG. 3, more accurate transistor level SPICE-like time domain simulations may be required to accurately account for circuit nonlinearities. But, performing repeated SPICE-like time domain simulations can be prohibitively expensive and time consuming, particularly when high order transistor-level models of the components of the circuit are used to achieve a high level of simulation accuracy and/or when the circuit has a large transient component in its time domain response.

In accordance with the present invention which is described more fully hereinbelow, the entire frequency domain response of a nonlinear microelectronic circuit, such as the switched-capacitor circuit of FIG. 3, can be obtained by performing a single time domain simulation with a multifrequency input signal containing all of the necessary frequencies in the desired frequency range. Accordingly, the above described "one-at-a-time" simulation technique is unnecessary and considerable time savings and economic efficiencies can be achieved.

Figure 4:
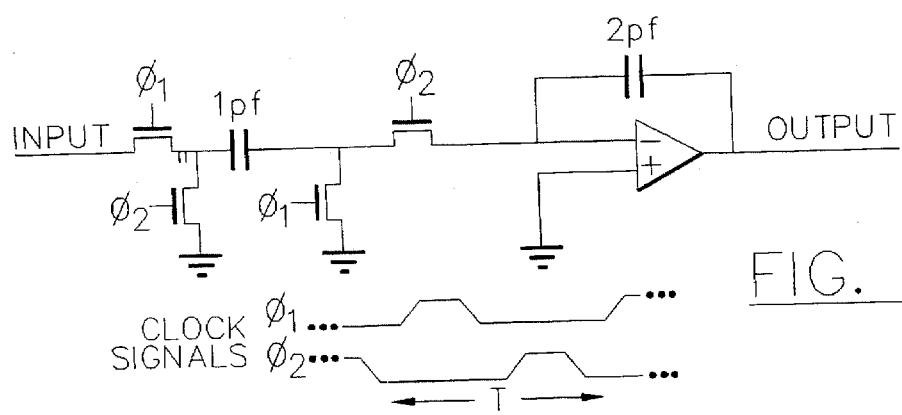
FIG. 4 illustrates an electrical schematic of a nonlinear switched-capacitor integrator circuit, according to the prior art.
Figure 5:
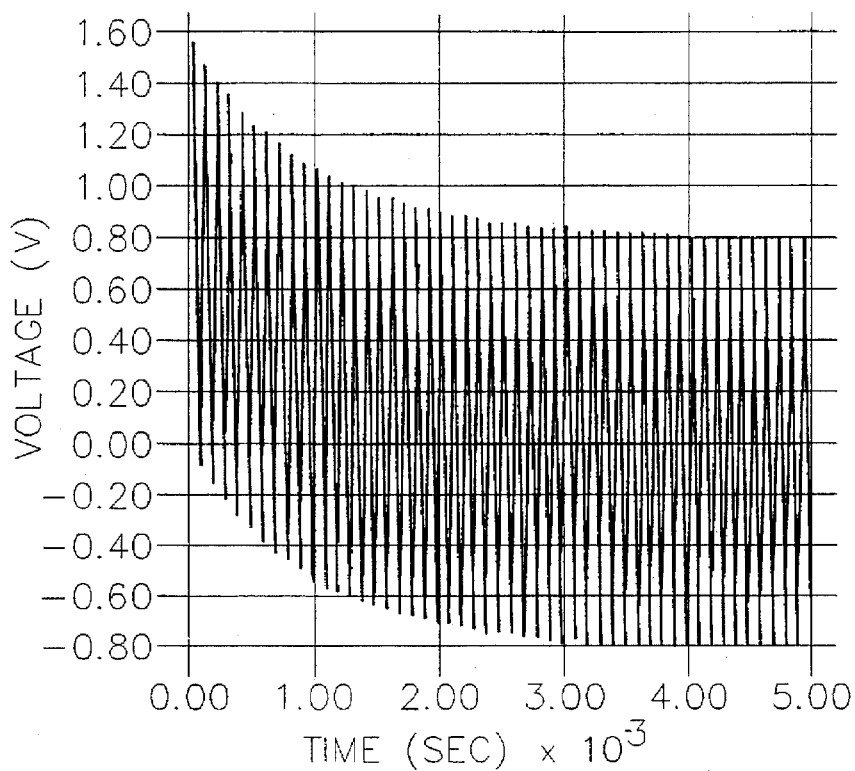
FIG. 5 illustrates the magnitude of a transient component waveform as a function of time, obtained from a time domain simulation of the integrator circuit of FIG. 4 using an input sinusoidal signal having a frequency of 10 kHz.

For example, referring now to the nonlinear switched-capacitor integrator circuit of FIG. 4, which uses two nonoverlapping 1 Mhz clock signals, the time savings and economic efficiencies of multifrequency simulation relative to one-at-a-time single frequency simulation will be illustrated. In particular, the integrator circuit was initially simulated in the time domain with an input signal having a single sinusoid of the form $V_{in}$=Asinωt, where the amplitude A was 0.1 volts and the frequency f was 10 kHz, where f=ω/2π. The actual simulation time on a SUN SPARCSTATION-10™ was 450 seconds, to achieve the 5 msec. simulation run illustrated at FIG. 5. Accordingly, for twenty frequencies, the simulation run time in the time domain would be roughly 20×450 seconds or 2.5 hours. The simulation methodology included iMACSIM which uses SPICE-like analysis techniques. As will be understood by those skilled in the art, because frequency domain information from nonlinear circuits can only be extracted from the steady-state component of the time-domain simulation, it is necessary to traverse the entire transient region, shown as approximately 5 msec. in FIG. 5, before terminating the time domain simulation.

The switched-capacitor integrator circuit of FIG. 4 was also simulated using as an input signal thereto, a multifrequency input signal comprised of a plurality of periodic component signals which overlap in time and have respective frequencies which extend over the desired frequency range. In particular, the input signal included a plurality of sinusoids of different frequencies and had the form $V_{in}$= $A_1 \sin\omega_1 t + A_2 \sin\omega_2 t + \ldots + A_N \sin\omega_N t$, where the amplitudes $A_1$–$A_{20}$ were 0.1 volts and the frequencies $f_1$–$f_{20}$ were 10 kHz, 17 kHz, 24 kHz, 32 kHz, 39 kHz, 46 kHz, 54 khz, 61 kHz, 68 kHz, 83 kHz, 91 kHz, 98 kHz, 105 kHz, 113 kHz, 120 kHz, 127 kHz, 135 kHz, 142 kHz and 150 kHz. Using this multifrequency input signal, the actual simulation time on a SUN SPARCSTATION-10™ using iMACSIM was 481 sec., to achieve the 5 msec. run illustrated at FIG. 6. This simulation time of 481 sec. is approximately equal to the 450 sec. simulation time for the above single frequency input signal example and results in a speedup of approximately twenty (20) times relative to a conventional one-at-a-time single frequency simulation approach when a frequency range spanning twenty (20) frequencies is considered.

Figure 6:
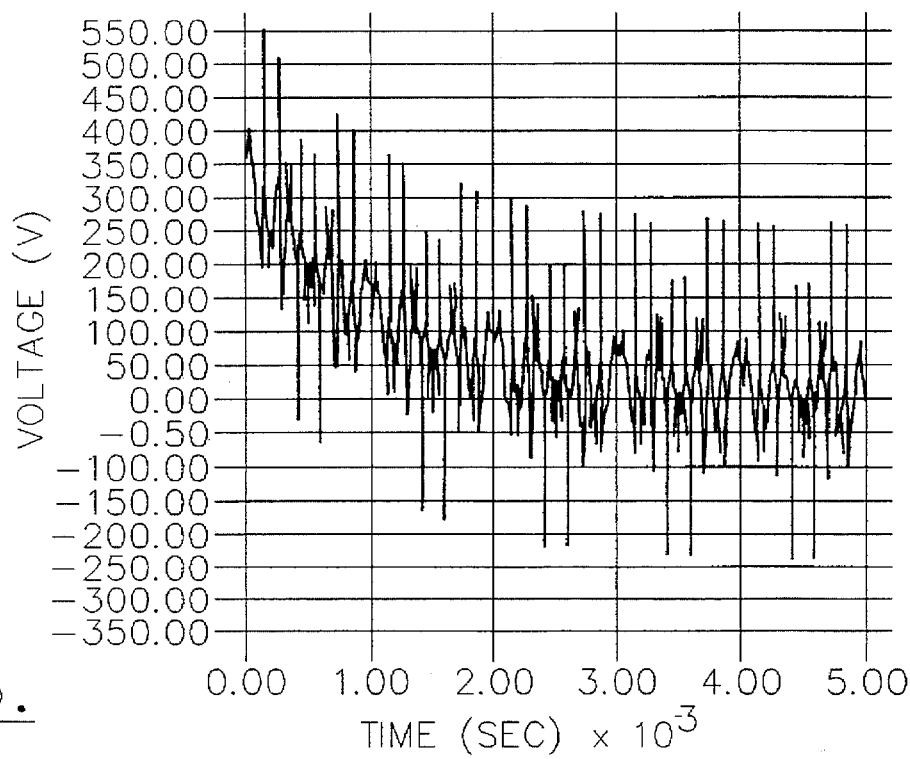
FIG. 6 illustrates the magnitude of a transient component waveform as a function of time, obtained from a time domain simulation of the integrator circuit of FIG. 4 using a multifrequency sinusoidal input signal containing twenty noninterfering frequencies.
Figure 7:
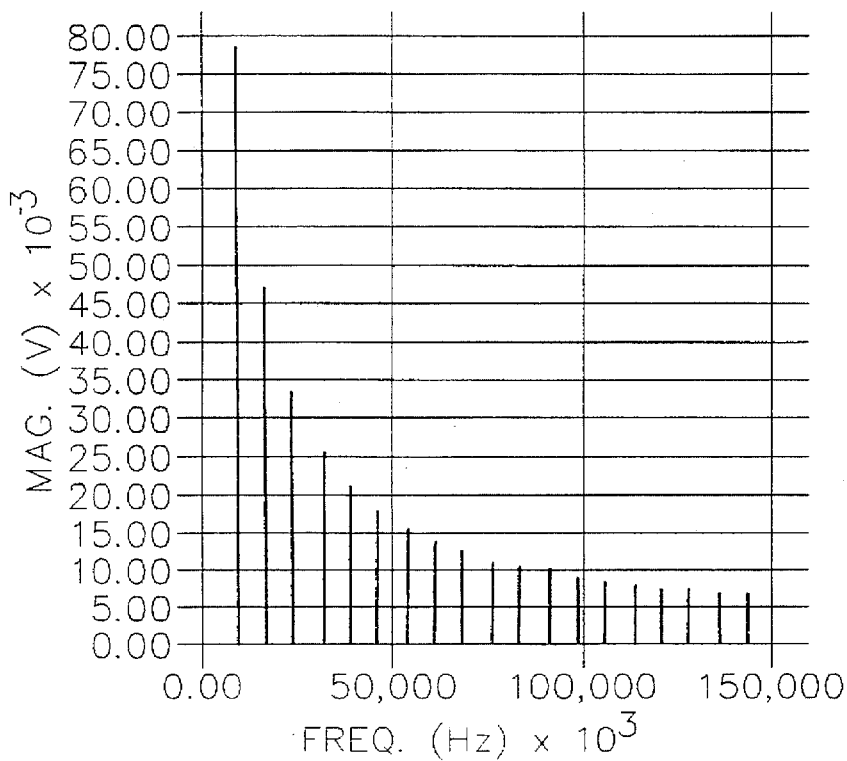
FIG. 7 illustrates a frequency domain response for the integrator circuit of FIG. 4, obtained by extracting the magnitude of the fundamental frequency domain components from the time domain simulation of FIG. 6.

In order to convert the time domain simulation of FIG. 6 to magnitude and phase values, each one of the fundamental components of the multifrequency input signal must be extracted. This can require the performance of twenty (20) discrete Fourier Transform (DFT) operations, however, the time required to perform these DFT operations is negligible relative to the simulation time required to traverse the transient region. As will be understood by those skilled in the art, the magnitude and phase values of the fundamental components can then be plotted to obtain the desired frequency response which includes the magnitude frequency response illustrated at FIG. 7.

Figure 8:
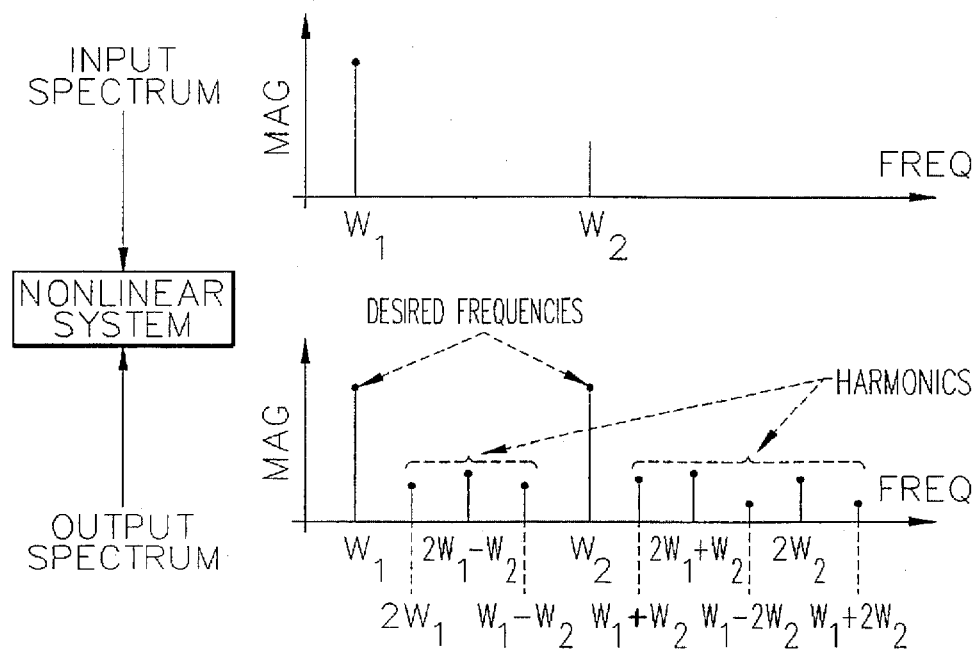
FIG. 8 illustrates the input and output frequency spectrum including second- and third-order harmonics for a nonlinear system stimulated with a two frequency input spectrum.

However, because the integrator circuit of FIG. 4 is a nonlinear circuit, its output in response to a multifrequency input signal will contain not only the fundamental frequencies of the input signal (e.g., $f_1$–$f_{20}$), but also all of the second and higher-order harmonics of the fundamental frequencies. In addition, not only will harmonics be generated, but intermodulation components at the sum and difference frequencies of the fundamental frequencies and their harmonics will also be generated. This is best described by FIG. 8 which shows the situation when a two frequency input spectrum is applied to a nonlinear system. For illustrative purposes, only the generated second-order harmonics and corresponding intermodulation components are shown in the output spectrum.

From a truncated generalized power series approximation of a nonlinear system in the form of $V_{out}=y \approx a_1 x + a_2 x^2 + a_3 x^3$ and common trigonometric identities, the second-order potentially interfering frequencies are found to be $2\omega_j$, $2\omega_k$, $\omega_j + \omega_k$, and $\omega_j - \omega_k$, where $\omega_j$ and $\omega_k$ represent any two of the N frequencies in the multifrequency input signal. The use of generalized power series expressions for modeling nonlinear circuits is more fully described in an article by G. W. Rhyne, et al. entitled *Frequency-Domain Nonlinear Circuit Analysis Using Generalized Power Series*, IEEE Transactions on Microwave Theory and Techniques, Vol. 36, No. 2, pp. 379–387 (1988), the disclosure of which is hereby incorporated herein by reference. Of course, if nonlinear effects higher than second-order were to be considered, the number of potentially interfering frequencies would also increase, as illustrated by Table 1 for the case where $V_{in}$=x=Asinω$_1$t+ Asinω$_2$t. Therefore, as the number of frequencies N in the desired frequency range increases and/or as the order of nonlinear interference being considered increases, the number of potentially interfering frequencies also increases and leads to a decrease in the size of the selection space for noninterfering frequencies.

TABLE 1

| | | order of nonlinearity | |
|---|---|---|---|
| | frequency | first | second | third |
| dc | 0 | | $a_2 A^2$ | |
| fundamentals | $\omega_1$ | $a_1 A$ | | $\dfrac{9 a_3 A^3}{4}$ |
| | $\omega_2$ | $a_1 A$ | | $\dfrac{9 a_3 A^3}{4}$ |
| harmonics | $2\omega_1$ | | $\dfrac{a_2 A^2}{2}$ | |
| | $2\omega_2$ | | $\dfrac{a_2 A^2}{2}$ | |
| | $3\omega_1$ | | | $\dfrac{a_3 A^3}{4}$ |
| | $3\omega_2$ | | | $\dfrac{a_3 A^3}{4}$ |
| intermodulation components (harmonics) | $\omega_1 + \omega_2$ | | $a_2 A^2$ | |
| | $\omega_1 - \omega_2$ | | $a_2 A^2$ | |
| | $2\omega_1 + \omega_2$ | | | $\dfrac{3 a_3 A^3}{4}$ |
| | $2\omega_1 - \omega_2$ | | | $\dfrac{3 a_3 A^3}{4}$ |
| | $\omega_1 + 2\omega_2$ | | | $\dfrac{3 a_3 A^3}{4}$ |
| | $\omega_1 - 2\omega_2$ | | | $\dfrac{3 a_3 A^3}{4}$ |

In particular, if these harmonic and intermodulation component frequencies occur at the selected fundamental frequencies used in the input signal, interference in the form of superposition of the harmonics will occur and cause significant corruption of any resulting nonlinear time domain simulation and frequency domain response based thereon. In contrast, the output of a linear circuit in response to a multifrequency input signal will only contain the fundamental frequencies of the input signal so it is unnecessary to consider harmonic interference effects. Thus, although nonlinear circuits such as the switched-capacitor filter and integrator circuits of FIGS. 3–4, respectively, may be simulated more accurately using conventional transistor level SPICE-like time domain simulation methodologies which handle nonlinearities, repeated one-at-a-time simulations in the time domain would still be necessary to prevent harmonic interferences if these simulation techniques are employed.

However, the present invention as now described reduces and preferably eliminates all significant harmonic interferences and thereby allows the above described efficiencies of multifrequency simulation over one-at-a-time simulation to be realized using time domain simulation methodologies which are capable of handling nonlinearities. To illustrate, consider again the situation where a two frequency input signal in the form of $V_{in}=x=A\sin\omega_1 t+A\sin\omega_2 t$ is applied to a nonlinear microelectronic circuit. According to Table 1, any output signal y will be composed of one d.c. component and twelve potentially interfering frequency components based on the above generalized power series expansion. The amplitude of each of these thirteen terms is also displayed along with its corresponding frequency in Table 1.

As determined by the inventors herein, proper selection of the two original fundamental frequencies $f_1$ ($\omega_1/2\pi$) and $f_2$ ($\omega_2/2\pi$) can eliminate any potential interference between the two fundamental frequencies and all harmonics (or intermodulation components) generated by second-order circuit nonlinearities. On the other hand, the harmonics generated by third-order circuit nonlinearities will corrupt the two fundamental frequencies $f_1$ and $f_2$. The amount of this corruption for each frequency can be calculated by determining the difference between the corresponding amplitude in Table 1 and the true amplitude in Table 2 for the single frequency case where $V_{in}=x=A\sin\omega_1 t$. This difference equals $3a_3A^3/2$. Thus, in order for the input, $x=A\sin\omega_1 t+A\sin\omega_2 t$, in this example to produce accurate results, the third-order term of the generalized power series approximation in Table 1 must be negligible. Fortunately, this condition is satisfied for most switched-capacitor circuits and continuous time filters, for example. In fact, the third harmonic is often 60 db to 100 db down from the fundamental, so any potential error is, in fact, negligible.

TABLE 2

| | | order of nonlinearity | | |
|---|---|---|---|---|
| | frequency | first | second | third |
| dc | 0 | | $\dfrac{a_2A^2}{2}$ | |
| fundamental | $\omega$ | $a_1A$ | | $\dfrac{3a_3A^3}{4}$ |

TABLE 2-continued

| | | order of nonlinearity | | |
|---|---|---|---|---|
| | frequency | first | second | third |
| harmonics | $2\omega_1$ | | $\dfrac{a_2A^2}{2}$ | |
| | $3\omega_1$ | | | $\dfrac{a_3A^3}{4}$ |

According to the present invention, the technique of using a multifrequency input signal to construct an accurate frequency domain response of a nonlinear microelectronic circuit, generally requires that the summation of a plurality of periodic component signals (e.g., sinusoidal signals) does not significantly alter the contribution of each periodic component signal to the output response. This generally requires that the nonlinear effects from the above described generalized power series terms of third and higher order are negligible relative to the first order terms. If this requirement is met, then the only harmonics (and intermodulation components) capable of corrupting the contributions of the periodic component signals to the output response are those generated from the second-order generalized power series terms, namely, $2\omega_j$, $2\omega_k$, $\omega_j+\omega_k$, and $\omega_j-\omega_k$, where $\omega_j$ and $\omega_k$ represent any two of the N frequencies in the input signal.

Because of the complex relationship of fundamental frequencies to their harmonic and intermodulation components, the selection of noninterfering frequencies within the desired frequency range is best handled by a computer program or application specific hardware. This program can be included as a "front end" to a conventional time domain simulation program such as SPICE, thereby allowing all input nodes to come from a stored representation of the microelectronic circuit and corresponding netlist, or separated into a stand-alone program requiring more user interaction. Regardless of the particular implementation of the present invention, three steps are generally required: (1) generate an initial set of fundamental frequencies within the desired frequency range for a respective plurality of periodic component signals (e.g., sinusoids), (2) determine potential second-order interferences among the component signals based on the fundamental frequencies and their harmonics and intermodulation components and (3) adjust at least one of the frequencies, if necessary, to reduce potential interferences among the component signals. These latter two steps may be repeated until little or no second-order interference is present.

The issue of precision should also be addressed when determining noninterfering frequencies. Given unlimited precision, the problem of selecting noninterfering frequencies may become trivial due to the unlimited number of possible fractional digits. Combining frequencies with many fractional digits, however, poses a problem in the determination of a steady-state period. The steady-state period for a combination of frequencies will always be equal to the period of the greatest common divisor of the frequencies, however the greatest common divisor is reduced if fractional digits are considered. Therefore, integer frequencies should be used to maximize the greatest common divisor and thereby reduce the steady-state period and corresponding simulation time.

Figure 9:
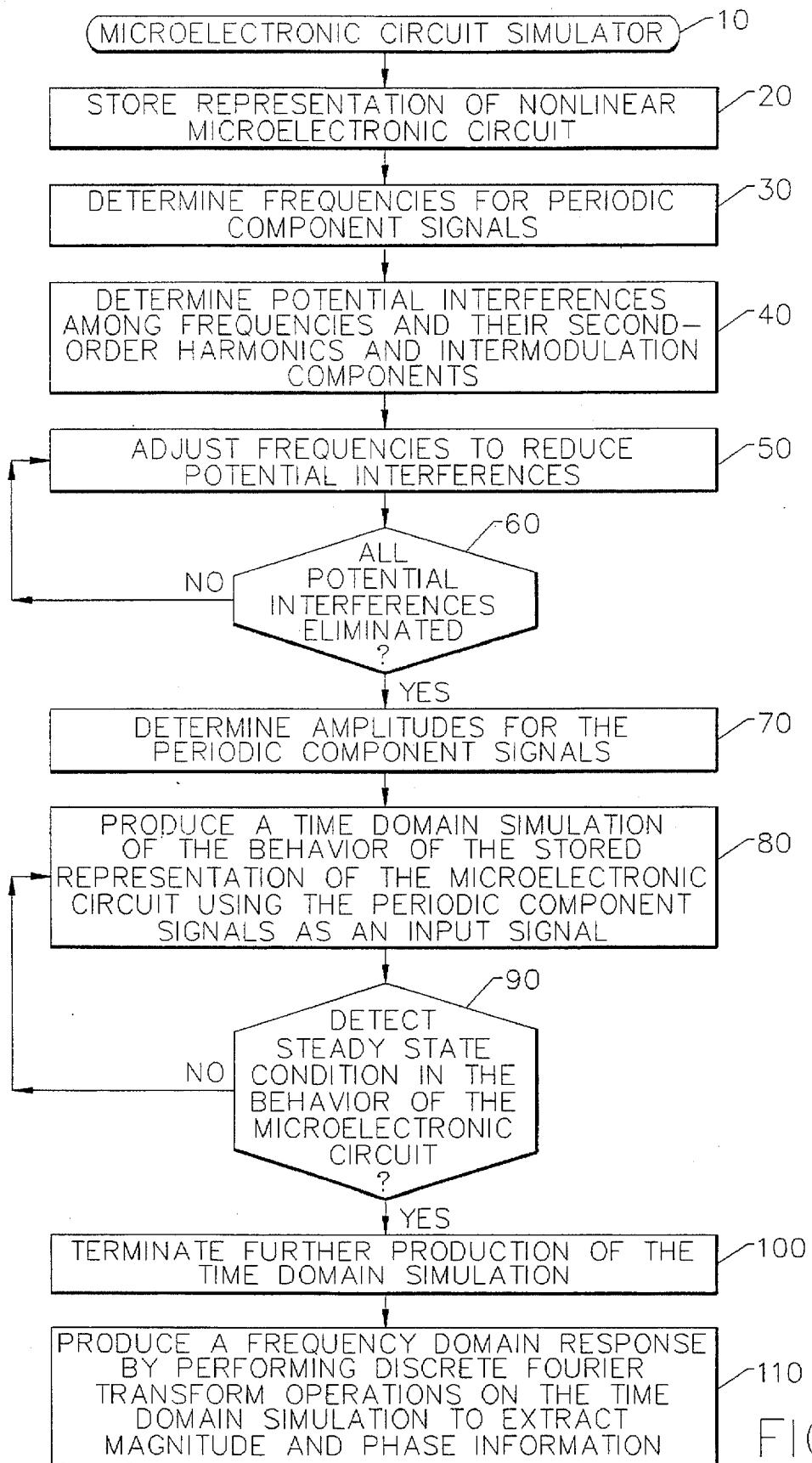
FIG. 9 illustrates the operations performed by the microelectronic circuit simulator illustrated in FIG. 2.

One possible method for determining noninterfering frequencies according to the present invention is illustrated in FIG. 9. Here, the user enters a minimum frequency, $f_{min}$, a maximum frequency, $f_{max}$, and the number of noninterfering frequencies desired, N, within the frequency range defined by $f_{min}$ and $f_{max}$. An initial set of evenly spaced frequencies is then determined and a check is performed to determine whether any interferences between the frequencies and their harmonic (and intermodulation) components are present. Individual frequencies are then perturbed by incrementing (or decrementing) their value by an integer amount until no interference remains. This methodology assumes that the given frequency range is linear and is to be filled by roughly evenly spaced frequencies, which may or may not produce optimum results for a particular circuit. Because most frequency responses are plotted with a logarithmic frequency scale, the frequencies selected to represent a given frequency range should be evenly spaced on the logarithmic scale, which results in an uneven spacing on a linear scale. The nonuniformity of even spacing on a logarithmic scale can create problems in frequency selection by packing the frequencies in the lower end of the frequency range. But, because precision must be controlled to keep the steady-state period at a low value as described above, very few spaces are typically available at the lower end for adjustment of the frequencies to avoid interference. Consequently, a given frequency range can be filled with many more linearly spaced noninterfering frequencies than logarithmically spaced ones. For this reason, a more preferable perturbation methodology is required.

According to a preferred methodology, instead of choosing the first frequency causing interference from the low end (or high end) of the frequency range and adjusting it until all interference is eliminated, a weighted selection procedure is preferred to select the frequency responsible for the greatest number of interferences and then adjusting it until it no longer interferes with the other frequencies and their harmonics and intermodulation components. An illustrative example of filling the frequency space from 1 to 70 (Hz, kHz, or MHz) with seven logarithmically spaced integer frequencies will now be described to illustrate the preferred weighted selection procedure. For this example, the weighted selection procedure requires three iterations, illustrated below, to arrive at seven noninterfering frequencies. The seven integers illustrated below are the seven frequencies, which include a minimum frequency ($f_1$), five intermediate frequencies ($f_2$–$f_6$) and a maximum frequency ($f_7$). The seven numbers in parentheses are their associated weights. For example, intermediate frequency $f_4$ initially has a weight of three (3) because in accordance with Table 1, $f_4 \times 2 = f_5$, $f_3 \times 2 = f_4$ and $f_5 - f_4 = f_4$. The frequency with the highest weight in each iteration is first incremented one step and then new weights are established. When the largest weight is held by more than one frequency, the higher of the two frequencies having the same weight is addressed first since the distribution of frequencies is more spread out at the high frequency end of the range. The lowest and highest frequencies in the range are chosen by the user and are therefore considered fixed and are not assigned weights.

| freqency | $f_1$ | $f_2$ | $f_3$ | $f_4$ | $f_5$ | $f_6$ | $f_7$ |
| --- | --- | --- | --- | --- | --- | --- | --- |
| initial | 1 (x) | 2 (3) | 4 (3) | 8 (3) | 16 (1) | 34 (0) | 70 (x) |
| first iteration | 1 (x) | 2 (3) | 4 (1) | 9 (0) | 16 (0) | 34 (0) | 70 (x) |
| second iteration | 1 (x) | 3 (2) | 4 (2) | 9 (0) | 16 (0) | 34 (0) | 70 (x) |
| third iteration | 1 (x) | 3 (0) | 5 (0) | 9 (0) | 16 (0) | 34 (0) | 70 (x) |

With this weighting procedure, three changes to the initial frequencies must be made in order to arrive at seven noninterfering frequencies. As a comparison, a simpler unweighted selection procedure was also considered with the same initial frequencies and by traversing through the frequencies from left to right (or right to left). Each interfering frequency encountered was adjusted upward until it no longer interfered with the other frequencies and their harmonics and intermodulation components. However, regardless of whether a left to right (low to high) or right to left (high to low) procedure was followed, only six noninterfering frequencies could be obtained in the range from 1 to 70. These six frequencies were 1, 6, 9, 16, 34 and 70 from left to right and 1, 6, 10, 18, 34 and 70 from right to left. Thus, not only does the simpler procedure fail to place all seven frequencies, it also does a relatively poor job of evenly covering, on a logarithmic scale, the desired frequency range with the six noninterfering frequencies. Accordingly, the weighted selection procedure is preferred for choosing logarithmically spaced noninterfering frequencies.

Referring now to FIG. 9, there is illustrated an overview of the above described and additional operations performed by a microelectronic circuit simulator 10 according to the present invention. As shown, the first operation comprises storing a representation of the microelectronic circuit at Block 20 using conventional techniques. The representation of the microelectronic circuit includes a representation of the active devices and additional linear and nonlinear interconnect elements of the circuit. It will be understood by those having skill in the art that the entire microelectronic circuit may be described in terms of a "netlist" which defines the component types, component values and connecting nodes for all the co.mponents.

Then, as shown in Block 30, a first plurality of frequencies (e.g., $\omega_1$–$\omega_N$), which are preferably linear or logarithmically spaced, are determined for a corresponding plurality of periodic component signals to be used as an input signal to Simulate the stored representation of the microelectronic circuit. Once a first set of frequencies has been established for a user selected frequency range, potential interferences among the frequencies and their harmonics and intermodulation components are determined, Block 40. As described above with respect to the weighted selection procedure, the intermediate frequencies ($\omega_2$–$\omega_{N-1}$) are then adjusted to reduce potential interferences, Block 50, and this step is repeated until all interferences have been eliminated, Block 60. During the frequency adjusting step, the intermediate frequency having the largest weight is preferably adjusted upward by one or more integer values until no interference is present with that frequency. If two or more intermediate frequencies have the same weight for a given iteration, the highest frequency with the largest weight will be adjusted first.

Figure 10:
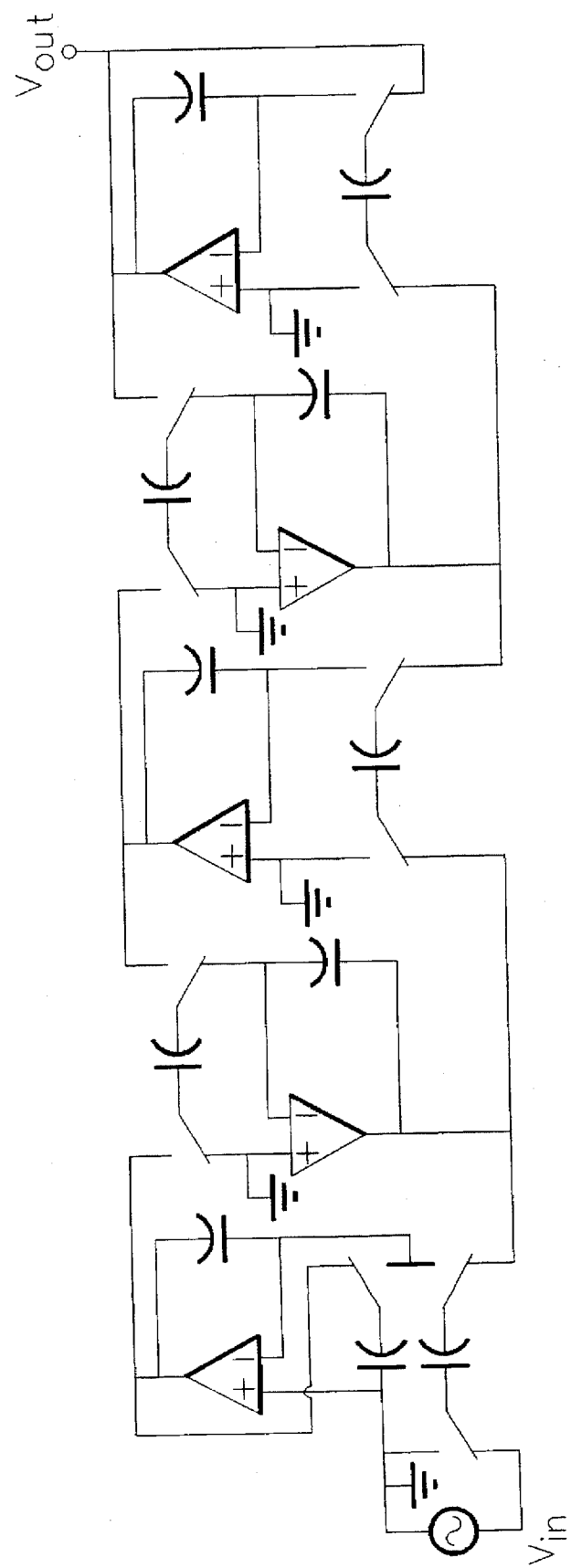
FIG. 10 illustrates an electrical schematic of a fifth-order Chebyshev filter, according to the prior art.
Figure 11A:
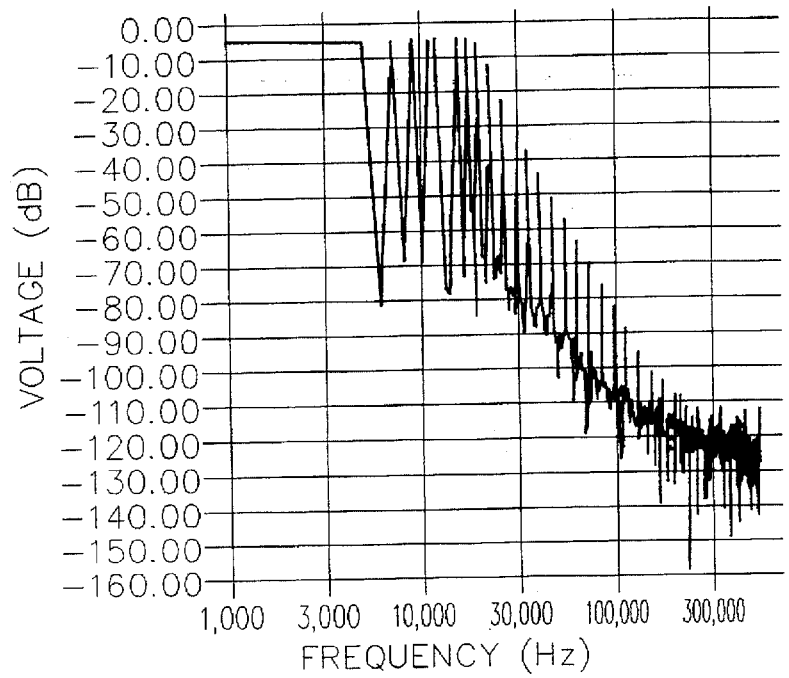
FIG. 11(a) illustrates a frequency domain response for the filter of FIG. 10, obtained by extracting the magnitude of the fundamental frequency domain components from a time domain simulation which uses as an input signal, a multi-frequency signal having equally scaled amplitudes.
Figure 11B:
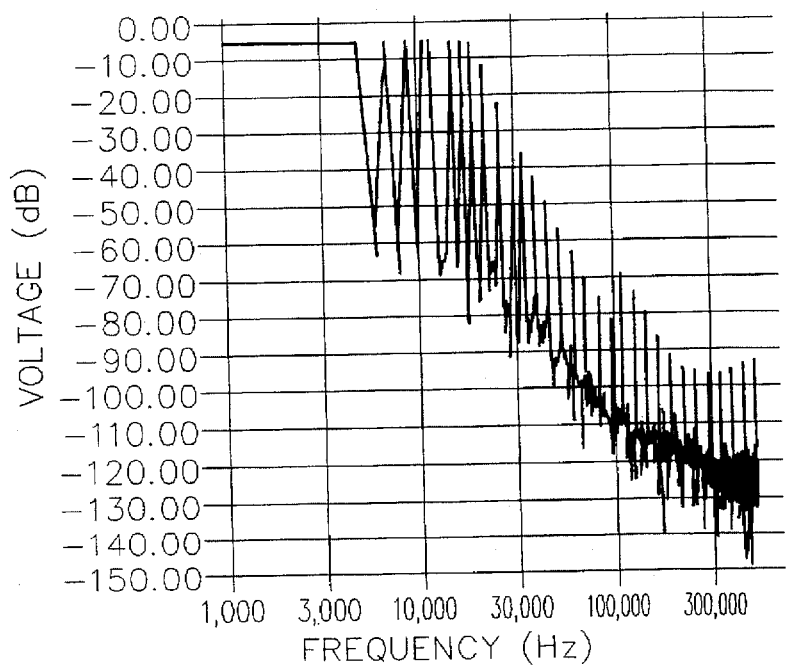
FIG. 11(b) illustrates a frequency domain response for the filter of FIG. 10, obtained by extracting the magnitude of the fundamental frequency domain components from a time domain simulation which uses as an input signal, a multi-frequency signal having weighted amplitudes.

When combining a plurality of periodic component signals into a multifrequency input signal, care must be taken to properly select the amplitudes $A_1$–$A_N$, where the input signal can be represented as $V_{in} = A_1 \sin\omega_1 t + A_2 \sin\omega_2 t + \ldots + A_N \sin\omega_N t$, Block 70. Depending on the values of the frequencies and the number of component signals to be summed, peak values in the input signal could drive the microelectronic circuit out of its linear range and consequently distort any time domain simulation and frequency domain response obtained therefrom. One method of choosing the amplitudes is to divide the amplitude appropriate for a single frequency input by the number of component signals (e.g., sinusolds) being summed and to assign that value as the amplitude for each component signal. This is an equal scaling approach. This method generally will not drive a circuit above its linear range, provided the single frequency amplitude was properly chosen. However, this number may limit the total number of frequencies than can be selected in the desired frequency range, depending on the resolution of the simulator 10. Moreover, equal scaling of the amplitudes may not be possible. One effect of equal scaling of the amplitudes can be seen clearly with an example of the fifth-order Chebyshev filter illustrated at FIG. 10. Here, the use of an unweighted multifrequency input (i.e., equal amplitudes assigned to each component sinusoid) results in the corruption of high frequency response fundamentals by certain noise components. This phenomenon is illustrated at FIG. 11($a$), which shows all the integer frequency components extracted using a discrete Fourier Transform operation and also shows that the noise floor from either the circuit or the simulation tends to corrupt the higher frequency response components. In particular, the effect is most clearly evident in the frequency range greater than 100 kHz where the fundamental frequency components are so heavily attenuated that they become indistinguishable from the noise components.

To overcome this problem, the input frequencies in the range of 100+ kHz were assigned greater amplitudes at the input (i.e., weighted), thereby elevating their frequency response components above the noise floor as seen in FIG. 11($b$). If this weighting technique is used, a plot of the input signal should be made to insure proper driving levels within the linear range of the circuit. In addition, the input amplitude of each component signal should also be matched up with the corresponding extracted output amplitude in order to normalize the weighting effects and produce a true gain response. Finally, although one complete simulation of the circuit may be necessary to determine which, if any, input component signals should be weighted more heavily than others, a quick linearized frequency domain simulation can easily be performed to provide enough information about the frequency response of the circuit to determine the appropriate weighting values.

Once the appropriate amplitudes have been established using either the above described equal scaling or weighted scaling approach, a time domain simulation of the stored representation of the microelectronic circuit using the periodic component signals as an input signal is performed, Block 80. The use of such circuit simulation methodologies as SPICE or others which are capable of adequately addressing the nonlinearities and nonidealities of the circuit's components is appropriate. Preferably, the time domain simulation is not performed for a predetermined user selected time interval but instead, is automatically terminated once a steady state condition has been reached. This will insure that the simulation time will not be too short, and therefore useless to the accurate determination of a frequency domain response because of the presence of remaining transient components in the time domain response, or too long in which case the economic efficiencies of the present invention will be reduced.

As will be understood by those skilled in the art, the steady state condition, Block 90, refers to the point at which the output of the circuit remains periodically stable, meaning that the magnitude and phase no longer change appreciably with time. Therefore, one way to determine the steady state condition is to determine the magnitude and/or phase of a number of the frequency components periodically throughout the time domain simulation step using conventional techniques and check for the point in time at which they have converged to a consistent value. Experiments by the inventors indicate that the magnitudes by themselves are adequate in signaling the steady state condition and that only a few frequencies will typically accurately reflect the behavior of all other frequencies in the range. A preferred procedure is to calculate the magnitudes of the highest and lowest input frequencies during the performance of the time domain simulation and to compare the calculated magnitudes with the immediately preceding calculated values and then terminate further production of the time domain simulation, Block 100, if the compared values fall within a preselected acceptable value indicative of steady state (i.e., if the difference in the compared values is sufficiently small).

As will be understood by those skilled in the art, once the time domain simulation has been completed, the frequency domain response of the nonlinear microelectronic circuit across the desired frequency range may be extracted from the time domain simulation output data, Block 110. According to the present invention, this can be accomplished by, first, breaking the data down into evenly spaced samples, and then performing a frequency selective discrete Fourier Transform (DFT) operation, known to those skilled in the art, to determine the magnitude and phase of each fundamental frequency of the output. The selection of evenly spaced intervals is typically necessary because the discrete Fourier Transform requires the time domain signal to be sampled at evenly spaced points in time. Since a time domain simulation methodology such as SPICE varies the solution time points of the circuit in order to reduce simulation time, the output data must be evenly sampled before performing the DFT. Moreover, because of the nature of such nonlinear circuits such as switched capacitor circuits, to generate sample-and-hold type outputs with extremely high frequency spikes that occur at every transition of the clocking signal but which do not contribute anything to the frequency response of the circuit, the output data can be sampled at the clock frequency. To avoid erroneous results caused by the clock transition, the samples are preferably obtained at the beginning of the clock transitions. These samples are then used to construct magnitude and phase plots to determine the frequency domain behavior of the microelectronic circuit.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A program storage readable by a computer tangibly embodying a program of instructions executable by the computer to perform method steps for simulating behavior of a nonlinear microelectronic circuit representation, said method steps comprising:

producing a time domain simulation of the behavior of the nonlinear microelectronic circuit representation over a time interval using as an input signal thereto a plurality of periodic signals which overlap in time during at least a portion of the time interval and have respective noninterfering frequencies that are preselected to eliminate second order interference components from the behavior of the nonlinear microelectronic circuit representation during the time interval so that the time interval can be traversed only once; and producing a frequency domain simulation of the nonlinear microelectronic circuit representation from the time domain simulation.

2. The program storage device of claim 1, wherein said step of producing a frequency domain simulation comprises producing from the time domain simulation, a frequency domain simulation of the nonlinear microelectronic circuit representation over a frequency range including the noninterfering frequencies.

3. The program storage device of claim 2, wherein the noninterfering frequencies are preselected by the steps of:

determining a first plurality of frequencies for the plurality of periodic signals;

determining potential interferences among the plurality of periodic signals based on the first plurality of frequencies and their respective harmonics and intermodulation components; and adjusting at least one of the first plurality of frequencies to reduce potential interferences among the plurality of periodic signals and thereby obtain a second plurality of frequencies for the periodic signals.

4. The program storage device of claim 3, wherein the first plurality of frequencies include a minimum frequency, intermediate frequencies and a maximum frequency; wherein said potential interferences determining step comprises determining interference weights for the intermediate frequencies; and wherein said adjusting step comprises adjusting an intermediate frequency having the largest weight upward or downward to reduce potential interferences.

5. The program storage device of claim 4, wherein in the event two or more intermediate frequencies have the same weight said adjusting step comprises adjusting the higher of the two or more intermediate frequencies having the same weight upward or downward to reduce potential interferences before adjusting the lower of the two or more intermediate frequencies having the same weight.

6. The program storage device of claim 4, wherein at least three of the intermediate frequencies within the first plurality of frequencies are logarithmically spaced and wherein said adjusting step comprises adjusting at least one of the at least three logarithmically spaced intermediate frequencies upward to reduce potential interferences.

7. The program storage device of claim 6, wherein said adjusting step is repeatedly performed to eliminate all second order interferences between the at least three logarithmically spaced intermediate frequencies.

8. The program storage device of claim 3, wherein said step of producing a frequency domain simulation comprises performing a discrete Fourier transform operation on the time domain simulation.

9. The program storage device of claim 8, wherein the discrete Fourier transform operation is performed to extract magnitude and phase information which relates to each of the plurality of periodic signals, from the time domain simulation.

10. The program storage device of claim 9, wherein the discrete Fourier transform operation is performed by sampling the time domain simulation at evenly spaced intervals within the time interval.

11. The program storage device of claim 3, wherein said step of producing a time domain simulation comprises producing a time domain simulation using SPICE.

12. The program storage device of claim 3, further comprising the step of determining at least two different amplitudes for respective ones of the plurality of periodic component signals by performing a linearized frequency domain simulation of the behavior of the nonlinear microelectronic circuit before performing said step of producing a time domain simulation.

13. The program storage device of claim 3, wherein said step of producing a frequency domain simulation is preceded by the step of detecting a steady state condition in the behavior of the nonlinear microelectronic circuit.

14. The program storage device of claim 13, wherein said step of producing a time domain simulation of the behavior of the nonlinear microelectronic circuit is terminated upon detection of the steady state condition.

15. An article of manufacture comprising a computer-usable medium having computer-readable program code means embodied therein for simulating behavior of a nonlinear microelectronic circuit representation, the computer-readable program code means embodied in said article of manufacture comprising:

computer-readable program code means for causing a computer to produce a time domain simulation of the behavior of the nonlinear microelectronic circuit representation over a time interval using as an input signal thereto a plurality of periodic signals which overlap in time during at least a portion of the time interval and have respective noninterfering frequencies that are preselected to eliminate second order interference components from the behavior of the nonlinear microelectronic circuit representation during the time interval so that the time interval can be traversed only once; and computer-readable program code means for causing the computer to produce a frequency domain simulation of the behavior of the nonlinear microelectronic circuit representation from the time domain simulation.

16. The article of manufacture of claim 15, wherein the computer-readable program code means embodied in said article of manufacture further comprises:

computer-readable program code means for causing the computer to preselect noninterfering frequencies by determining a first plurality of frequencies for the plurality of periodic signals; determining potential interferences among the plurality of periodic signals based on the first plurality of frequencies and their respective harmonics and intermodulation components; and adjusting at least one of the first plurality of frequencies to reduce potential interferences among the plurality of periodic signals and thereby obtain a second plurality of frequencies for the periodic signals.

17. The article of manufacture of claim 16, wherein the first plurality of frequencies include a minimum frequency, intermediate frequencies and a maximum frequency; and wherein said computer-readable program code means for causing the computer to preselect noninterfering frequencies comprises means for determining interference weights for the intermediate frequencies and adjusting an intermediate frequency having the largest weight upward or downward to reduce potential interferences.

18. The article of manufacture of claim 17, said computer-readable program code means for causing the computer to produce a frequency domain simulation of the behavior of the nonlinear microelectronic circuit representation comprises means for performing a discrete Fourier transform operation on the time domain simulation.

19. The article of manufacture of claim 18, wherein the discrete Fourier transform operation is performed to extract magnitude and phase information from the time domain simulation.

20. The article of manufacture of claim 19, wherein the discrete Fourier transform operation is performed by sampling the time domain simulation at evenly spaced intervals within the time interval.

* * * * *